US012660394B2

(12) United States Patent　　　(10) Patent No.:　US 12,660,394 B2
Kim et al.　　　　　　　　　　　　(45) Date of Patent:　Jun. 16, 2026

(54) DISPLAY DEVICE WITH PIXEL-INTEGRATED CLOSED RING OUTER ELECTRODE

(71) Applicant: Samsung Display Co., LTD., Yongin-si (KR)

(72) Inventors: Seul Ki Kim, Yongin-si (KR); Tae Jin Kong, Yongin-si (KR); Myeong Hee Kim, Yongin-si (KR); Ji Eun Park, Yongin-si (KR); Myeong Su So, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 374 days.

(21) Appl. No.: 18/325,216

(22) Filed: May 30, 2023

(65) Prior Publication Data

US 2024/0113268 A1　　　Apr. 4, 2024

(30) Foreign Application Priority Data

Sep. 30, 2022　(KR) ......................... 10-2022-0125673

(51) Int. Cl.
　　*H10H 20/857*　　(2025.01)
　　*G09G 3/3233*　　(2016.01)
　　*H10W 90/00*　　(2026.01)
(52) U.S. Cl.
　　CPC ......... *H10H 20/857* (2025.01); *G09G 3/3233* (2013.01); *H10W 90/00* (2026.01); *G09G 2300/0426* (2013.01); *G09G 2300/0819* (2013.01); *G09G 2300/0842* (2013.01); *G09G 2354/00* (2013.01)

(58) Field of Classification Search
CPC .... H10H 20/857; H10H 29/142; H10H 20/83; H01L 27/3246; H01L 51/5056; H01L 51/5072; H01L 51/5092; H01L 51/56; H01L 2227/323; H01L 27/3244; H01L 51/5088; H01L 25/167; H01L 25/0753; G09G 3/3233; G09G 2300/0426; G09G 2300/0819; G09G 2300/0842;
(Continued)

(56) References Cited

U.S. PATENT DOCUMENTS 8,018,141 B2 *　9/2011　Kim ..................... H10K 59/122
　　　　　　　　　　　　　　　　　　　313/506
8,822,998 B2 *　9/2014　Kim ..................... H10K 59/121
　　　　　　　　　　　　　　　　　　　313/506
(Continued)

FOREIGN PATENT DOCUMENTS

JP　　　　2021-157112　　10/2021
KR　　　　10-2305180　　9/2021
KR　　10-2022-0149892　　11/2022

*Primary Examiner* — Caleb E Henry
(74) *Attorney, Agent, or Firm* — CANTOR COLBURN LLP

(57) ABSTRACT

A display device includes a first electrode, an outer electrode surrounding the first electrode, a bank overlapping the outer electrode in a plan view, the bank including an opening that exposes the first electrode, a light emitting element disposed on the first electrode and in the opening of the bank, and a second electrode disposed on the light emitting element. The outer electrode may be electrically disconnected from the first electrode upon a bad contact between a light emitting member and the outer electrode. As a result, defective pixels can be repaired.

18 Claims, 12 Drawing Sheets

(58) Field of Classification Search
CPC ................. G09G 2354/00; G09G 3/32; G09G
2300/0413; G09G 2330/10
See application file for complete search history.

(56) References Cited

U.S. PATENT DOCUMENTS

| | | | |
|---|---|---|---|
| 8,912,983 B2 * | 12/2014 | Kim | G09G 3/3208 |
| | | | 349/40 |
| 9,111,891 B2 * | 8/2015 | Isobe | H10K 59/131 |
| 9,177,977 B2 * | 11/2015 | Akiyoshi | G02F 1/136286 |
| 9,240,567 B2 * | 1/2016 | Park | H10K 59/8731 |
| 9,324,947 B2 * | 4/2016 | Sato | H10K 71/211 |
| 9,614,015 B2 * | 4/2017 | Park | H10K 59/122 |
| 9,716,208 B2 * | 7/2017 | Dozen | H10H 20/01 |
| 9,991,305 B2 * | 6/2018 | Goden | H10F 39/192 |
| 10,128,308 B1 | 11/2018 | Shin et al. | |
| 10,403,861 B2 * | 9/2019 | Lee | H10K 59/124 |
| 10,756,292 B2 * | 8/2020 | Tang | H10K 59/1213 |
| 10,916,723 B2 * | 2/2021 | Lee | H10K 50/16 |
| 11,374,070 B2 * | 6/2022 | Hsu | H10K 59/123 |
| 11,380,743 B2 * | 7/2022 | Liu | H10K 50/171 |
| 11,424,270 B2 * | 8/2022 | Huang | H10D 86/411 |
| 11,569,411 B2 * | 1/2023 | Volpert | H10H 29/142 |
| 11,916,038 B2 * | 2/2024 | Saitoh | H01L 24/08 |
| 12,063,841 B2 * | 8/2024 | Shi | H10K 59/8051 |
| 12,245,476 B2 * | 3/2025 | Kim | H10K 59/124 |
| 2004/0228964 A1 * | 11/2004 | Ito | H10K 71/135 |
| | | | 427/256 |
| 2006/0097263 A1 * | 5/2006 | Lee | H10K 59/122 |
| | | | 257/72 |
| 2007/0159089 A1 * | 7/2007 | Oh | H10K 59/88 |
| | | | 313/506 |
| 2009/0128020 A1 * | 5/2009 | Takei | H10K 59/88 |
| | | | 313/504 |
| 2010/0181559 A1 * | 7/2010 | Nakatani | H10K 59/122 |
| | | | 438/34 |
| 2011/0233572 A1 * | 9/2011 | Nakatani | H10K 59/122 |
| | | | 257/88 |
| 2011/0254757 A1 * | 10/2011 | Kim | H10K 59/1315 |
| | | | 345/76 |
| 2011/0260955 A1 * | 10/2011 | Yoshida | H10K 59/122 |
| | | | 345/76 |
| 2013/0099221 A1 * | 4/2013 | Kawamura | H10K 59/122 |
| | | | 438/34 |
| 2013/0234126 A1 * | 9/2013 | Nakatani | H10K 50/805 |
| | | | 438/34 |
| 2014/0159074 A1 * | 6/2014 | Isobe | H10K 59/873 |
| | | | 438/34 |
| 2015/0171327 A1 * | 6/2015 | Matsushima | H10K 59/122 |
| | | | 438/35 |
| 2016/0093680 A1 * | 3/2016 | Paek | H10K 59/805 |
| | | | 438/34 |
| 2018/0254303 A1 * | 9/2018 | Mishima | H10K 59/876 |
| 2019/0115561 A1 * | 4/2019 | Tang | H10D 86/441 |
| 2020/0006661 A1 * | 1/2020 | Shinokawa | B23K 26/362 |
| 2020/0194513 A1 * | 6/2020 | Kim | H10K 59/122 |
| 2020/0227661 A1 * | 7/2020 | Nishikiori | H10K 59/35 |
| 2021/0183972 A1 * | 6/2021 | Son | H10K 59/173 |
| 2021/0191552 A1 * | 6/2021 | Bok | G09G 3/32 |
| 2022/0005893 A1 * | 1/2022 | Liu | H10K 59/122 |
| 2022/0352267 A1 | 11/2022 | Baek et al. | |

* cited by examiner

DISPLAY DEVICE WITH PIXEL-INTEGRATED CLOSED RING OUTER ELECTRODE

CROSS-REFERENCE TO RELATED APPLICATION

The application claims priority under 35 U.S.C. § 119 from Korean Patent Application No. 10-2022-0125673, filed in the Korean Intellectual Property Office on Sep. 30, 2022, the entire contents of which are incorporated herein by reference.

BACKGROUND

1. Technical Field

The disclosure relates to a display device.

2. Description of the Related Art

In recent years, as interest in information display is increasing, research and development on display devices are continuously being conducted.

SUMMARY

An object of the disclosure is to provide a display device capable of repairing a defective pixel.

Objects of the disclosure may not be limited to the above-mentioned object, and other technical objects not mentioned will be clearly understood by those skilled in the art from the following description.

In order to achieve the object of the disclosure, a display device according to an embodiment of the disclosure may include a first electrode, an outer electrode surrounding the first electrode, a bank overlapping the outer electrode in a plan view, the bank may include an opening exposing the first electrode, a light emitting element disposed on the first electrode and in the opening of the bank, and a second electrode disposed on the light emitting element.

The outer electrode may be spaced apart from the first electrode.

The display device may further include a connection part disposed between the outer electrode and the first electrode.

The first electrode, the outer electrode, and the connection part may be disposed on a same layer.

An end of the outer electrode may be electrically connected to a side of the connection part, and another end of the outer electrode may be electrically connected to another side of the connection part.

The outer electrode may be electrically disconnected from the connection part.

The outer electrode may be electrically connected to the first electrode.

The outer electrode may be separated from the first electrode.

The display device may further include a dummy light emitting element disposed on the outer electrode.

The dummy light emitting element may partially overlap the bank in a plan view.

The first electrode and the outer electrode may be disposed on a same layer.

In order to achieve the object of the disclosure, a display device according to another embodiment of the disclosure may include a first pixel and a second pixel. Each of the first pixel and the second pixel may include a first electrode, an outer electrode surrounding the first electrode, a bank overlapping the outer electrode in a plan view, the bank may include an opening that exposes the first electrode, a light emitting element disposed on the first electrode and in the opening of the bank, and a second electrode disposed on the light emitting element.

The outer electrode may be spaced apart from the first electrode in each of the first and second pixels.

The display device may further include a connection part disposed between the outer electrode and the first electrode in each of the first and second pixels.

An end of the outer electrode of the first pixel may be electrically connected to a side of the connection part, and another end of the outer electrode of the first pixel may be electrically connected to another side of the connection part.

The outer electrode of the second pixel may be separated from the connection part of the second pixel.

The outer electrode of the first pixel may be electrically connected to the first electrode of the first pixel.

The outer electrode of the second pixel may be separated from the first electrode of the second pixel.

The second pixel may further include a dummy light emitting element disposed on the outer electrode of the second pixel.

The dummy light emitting element may partially overlap the bank in a plan view.

Details of other embodiments are included in the detailed description and drawings. However, embodiments of the disclosure are not limited to those set forth herein. The above and other embodiments will become more apparent to one of ordinary skill in the art to which the disclosure pertains by referencing the detailed description of the disclosure given below.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 5 is a perspective view of a light emitting element according to an embodiment;

FIG. 6 is a schematic cross-sectional view of the light emitting element according to an embodiment;

FIG. 9 is a schematic cross-sectional view taken along line A-A' of FIG. 7; and

DETAILED DESCRIPTION OF THE EMBODIMENTS

Figure 1:
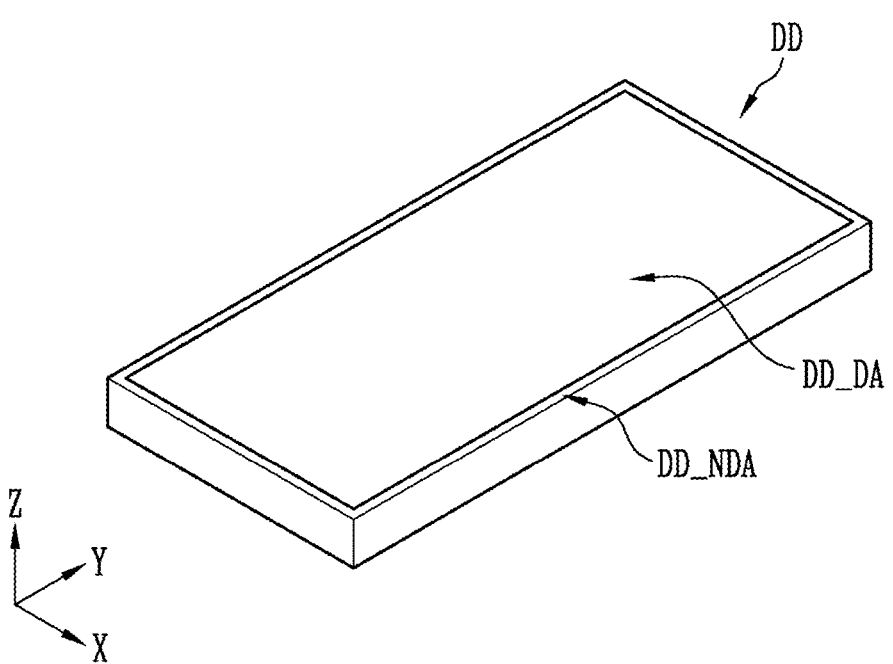
FIG. 1 is a perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Hereinafter, embodiments of the disclosure will be described in more detail with reference to the accompanying drawings.

Figure 2:
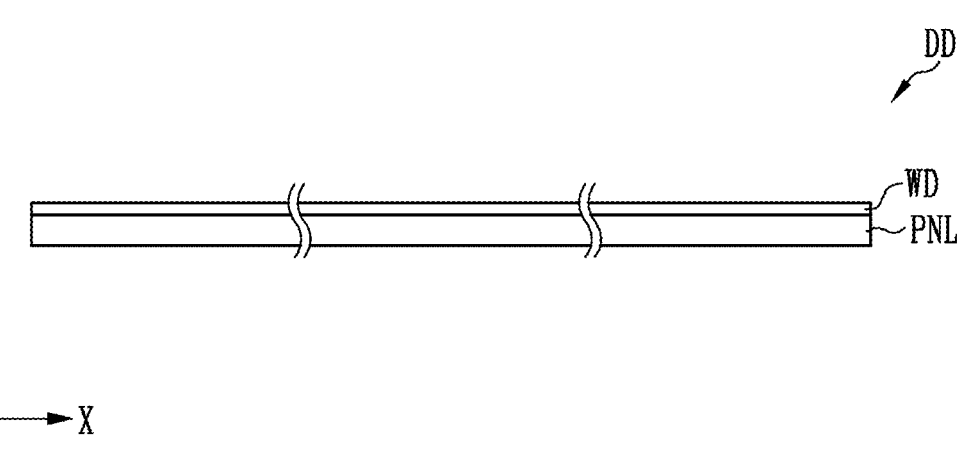
FIG. 2 is a schematic cross-sectional view of the display device according to an embodiment.
Figure 3:
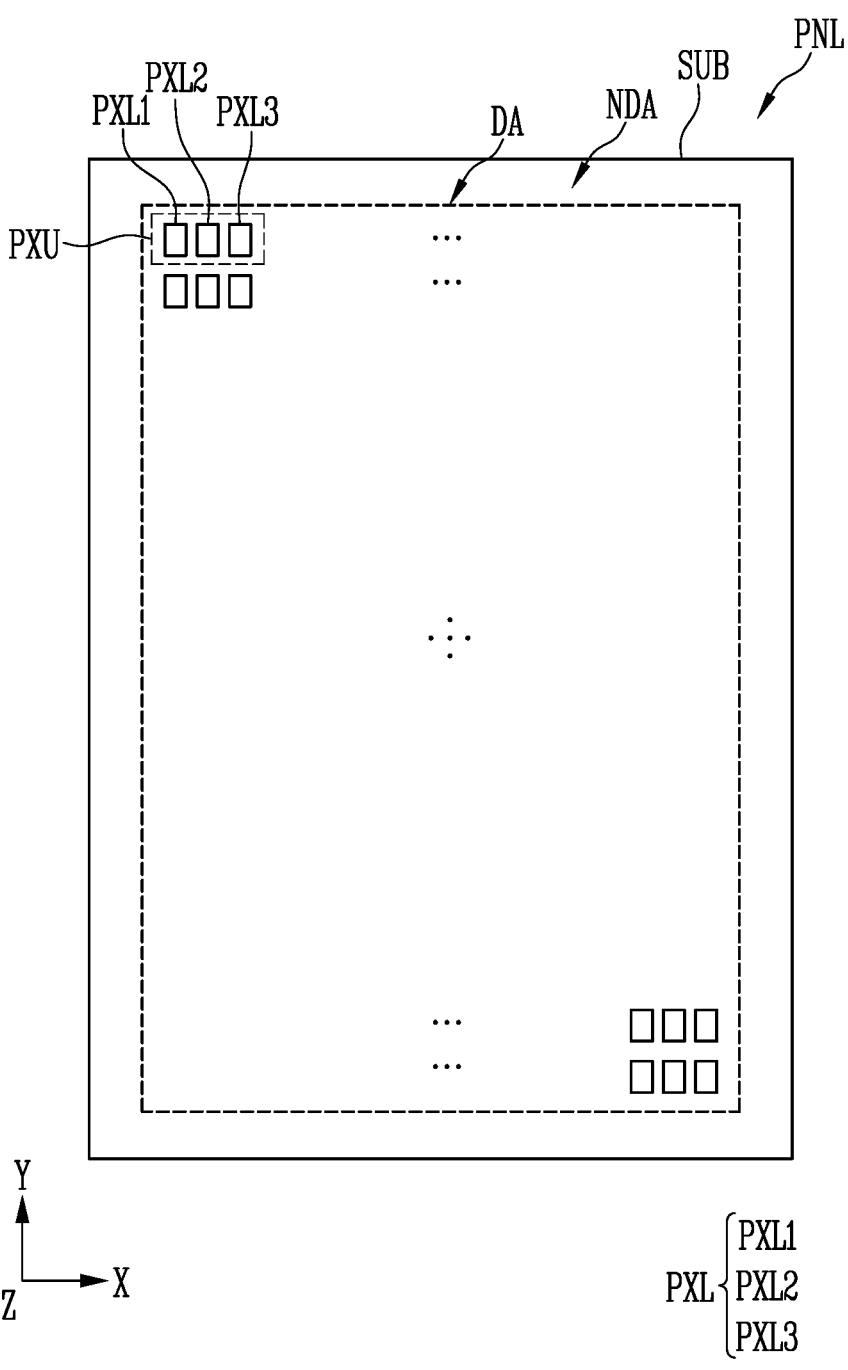
FIG. 3 is a plan view of a display panel according to an embodiment.

FIG. 1 is a perspective view of a display device according to an embodiment, FIG. 2 is a schematic cross-sectional view of the display device according to an embodiment, and FIG. 3 is a plan view of a display panel according to an embodiment.

Referring to FIGS. 1 to 3, a display device DD may include a display panel PNL and a window WD. The display device DD may include a display area DD_DA that displays an image and a non-display area DD_NDA that does not display an image. The non-display area DD_NDA may be provided on at least one side of the display area DD_DA. For example, the non-display area DD_NDA may be provided to surround the display area DD_DA.

The display device DD may be provided in the form of a rectangular plate having angled corners. However, according to an embodiment, the corners of the display device DD may instead have a curved shape. However, the disclosure may not be necessarily limited thereto, as the display device DD may instead be implemented in various shapes.

The display device DD may be applied to an electronic device having a display surface applied to at least one surface, such as a smartphone, a television, a tablet PC, a mobile phone, a video phone, an e-book reader, a desktop PC, a laptop PC, a netbook computer, a workstation, a server, a PDA, a PMP (portable multimedia player), an MP3 player, a medical device, a camera, a wearable display device, or a combination thereof.

The display panel PNL and a substrate SUB for forming the same may include a display area DA for displaying an image and a non-display area NDA excluding the display area DA. The display area DA may constitute a screen on which an image may be displayed, and the non-display area NDA may be an area other than the display area DA.

For convenience of description, FIG. 3 schematically shows the structure of the display panel PNL with the display area DA at the center. Although not shown in FIG. 3, at least one driving circuit part (for example, at least one of a scan driver and a data driver), wirings, and/or pads may be further disposed on the display panel PNL.

A pixel part PXU may be disposed in the display area DA. The pixel part PXU may include a first pixel PXL1, a second pixel PXL2, and/or a third pixel PXL3. Hereinafter, in case that at least one pixel among the first pixel PXL1, the second pixel PXL2, and the third pixel PXL3 is arbitrarily referred to, or in case that two or more types of pixels are generically referred to, they will be referred to as "pixel PXL" or "pixels PXL".

Pixels PXL may be regularly arranged according to a stripe or PENTILE™ arrangement structure. However, the arrangement structure of the pixels PXL may not be limited thereto, as the pixels PXL may instead be arranged in the display area DA in various other structures and/or manners.

According to an embodiment, two or more types of pixels PXL emitting light of different colors may be disposed in the display area DA. For example, first pixels PXL1 emitting light of a first color, second pixels PXL2 emitting light of a second color, and third pixels PXL3 emitting light of a third color may be arranged in the display area DA. The first to third pixels PXL1, PXL2, and PXL3 disposed adjacent to each other may constitute one pixel part PXU capable of emitting light of various colors. For example, the first pixel PXL1 may be a red pixel emitting red light, the second pixel PXL2 may be a green pixel emitting green light, and the third pixel PXL3 may be a blue pixel emitting blue light, but the disclosure may not be limited thereto. FIGS. 1 and 2 show the pixel part PXU including one first pixel PXL1, one second pixel PXL2, and one third pixel PXL3 as an example, but the disclosure may not be necessarily limited thereto. For example, the pixel part PXU may instead include one first pixel PXL1, two second pixels PXL2, and one third pixel PXL3.

The first pixel PXL1, the second pixel PXL2, and the third pixel PXL3 may include light emitting elements LD emitting light of a same color, and may respectively emit light of the first color, the second color, and the third color by including color conversion layers of different colors disposed on each of the light emitting elements LD.

The first pixel PXL1, the second pixel PXL2, and the third pixel PXL3 may instead include a light emitting element LD of the first color, a light emitting element LD of the second color, and a light emitting element LD of the third color as light sources, respectively, so that light of the first color, light of the second color, and light of the third color may be emitted, respectively. However, the color of the light emitted by each pixel PXL may be variously changed.

The pixel PXL may include at least one light emitting element LD driven by a control signal (for example, a scan signal and a data signal) and/or a power source (for example, a first power source and a second power source). The pixel PXL may be configured as an active type pixel. However, the types, structures, and/or driving methods of the pixels PXL applicable to the display device may not be particularly limited. For example, each pixel PXL may be configured as a pixel of a passive or active type light emitting display device having various structures and/or driving methods.

The window WD for protecting an exposed surface of the display panel PNL may be provided on the display panel PNL. The window WD may protect the display panel PNL from external impact and may provide an input surface and/or a display surface to a user. The window WD may be extended to the display panel PNL by using an optically transparent adhesive member (not shown). The window WD may have a multi-layer structure selected from a glass substrate, a plastic film, a plastic substrate, and a combination thereof. The multi-layer structure may be formed through a continuous process or an adhesion process using an adhesive layer. The window WD may be wholly or partially flexible.

A touch sensor (not shown) may be disposed between the display panel PNL and the window WD. The touch sensor may be disposed on (e.g., directly on) a surface on which an image may be emitted from the display panel PNL to receive a user's touch input.

Figure 4:
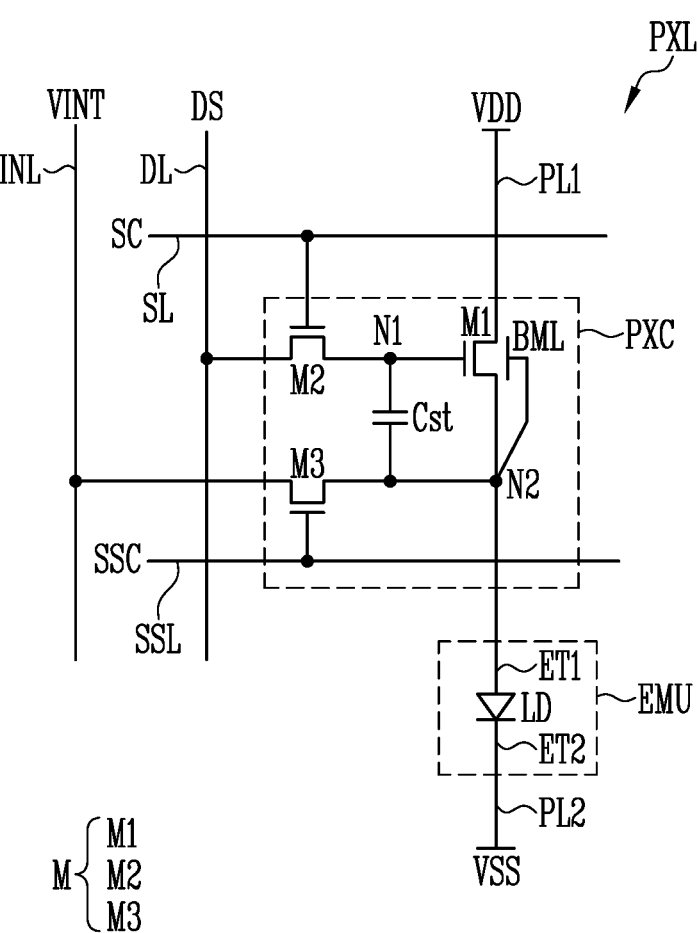
FIG. 4 is a schematic diagram of an equivalent circuit of a pixel according to an embodiment.

FIG. 4 is a schematic diagram of an equivalent circuit of a pixel according to an embodiment. According to an embodiment, each pixel PXL shown in FIG. 4 may be any one of the pixels PXL of FIG. 3. For example, the pixel PXL of FIG. 4 may be any one of the first pixel PXL1, the second pixel PXL2, and the third pixel PXL3. The pixels PXL disposed in the display area DA may have substantially a same or similar structure to each other. The pixels PXL may instead have various structures other than the structure disclosed in the embodiment of FIG. 4.

Referring to FIG. 4, the pixel PXL may be electrically connected to a scan line SL and a data line DL. The pixel PXL may be electrically connected to a first power source VDD (or a first power source line PL1) and a second power source VSS (or a second power source line PL2). In an embodiment, the pixel PXL may be further electrically connected to at least one other signal line and/or power source line. For example, the pixel PXL may be electrically connected to a control line SSL and an initialization power source line INL to which a voltage of an initialization power source VINT may be applied.

The pixel PXL may include an emission part (or emission unit) EMU for generating light with a luminance corresponding to each data signal DS. The pixel PXL may further include a pixel circuit PXC for driving the emission part EMU. The emission part EMU may include a first electrode ET1, a second electrode ET2, and at least one light emitting element LD electrically connected between the first and second electrodes ET1 and ET2.

The light emitting element LD may be electrically connected to the first power source VDD through the first electrode ET1 and/or the pixel circuit PXC, and may be electrically connected to the second power source VSS through the second electrode ET2. The first power source VDD and the second power source VSS may supply voltages having different potentials. A potential difference between the first power source VDD and the second power source VSS may be equal to or greater than a threshold voltage of the light emitting element LD.

In an embodiment, the emission part EMU may include a single light emitting element LD electrically connected in a forward direction between the pixel circuit PXC and the second power source VSS. In another embodiment, the emission part EMU may include multiple light emitting elements LD electrically connected in a forward direction between the first power source VDD and the second power source VSS. For example, the emission part EMU may include multiple light emitting elements LD electrically connected in parallel, in series, or both in series and parallel between the pixel circuit PXC and the second power source VSS. In an embodiment, each light emitting element LD may be an inorganic light emitting diode manufactured with a small size ranging from nanometers to micrometers using a nitride-based semiconductor material, a phosphide-based semiconductor material, the like, or a combination thereof but the disclosure may not necessarily be limited thereto. The type, connection structure, and/or number of the light emitting elements LD constituting the emission part EMU may be variously changed according to embodiments.

At least a light emitting element LD electrically connected in a forward direction between the first power source VDD and the second power source VSS may constitute an effective light source of each pixel PXL. In case that a driving current is supplied to each light emitting element LD through the pixel circuit PXC of a corresponding pixel PXL, the light emitting element LD may emit light with a luminance corresponding to the driving current. Accordingly, the pixel PXL may emit light with a luminance corresponding to the driving current.

The pixel circuit PXC may be electrically connected between the first power source VDD and the emission part EMU. The pixel circuit PXC may be electrically connected to the scan line SL and the data line DL, and may receive a scan signal SC and a data signal DS from the scan line SL and the data line DL, respectively. The pixel circuit PXC may also be electrically connected to the control line SSL and the initialization power source line INL, and may receive a control signal SSC and the initialization power source VINT from the control line SSL and the initialization power source line INL, respectively.

The pixel circuit PXC may include at least a transistor M and a capacitor Cst. For example, the pixel circuit PXC may include a first transistor M1, a second transistor M2, a third transistor M3, and the capacitor Cst.

The first transistor M1 may be electrically connected between the first power source VDD and a second node N2. The second node N2 may be a node in which the pixel circuit PXC and the emission part EMU may be electrically connected to each other. For example, the second node N2 may be a node in which an electrode (for example, a source electrode) of the first transistor M1 and the first electrode ET1 (for example, an anode electrode) of the emission part EMU may be electrically connected to each other. A gate electrode of the first transistor M1 may be electrically connected to a first node N1.

The first transistor M1 may be a driving transistor of each pixel PXL. For example, the first transistor M1 may be electrically connected between the first power source line PL1 and the first electrode ET1 of each pixel PXL to control the driving current supplied to the emission part EMU in response to a voltage at the first node N1.

In an embodiment, the first transistor M1 may further include a lower conductive layer BML (also referred to as a "back gate electrode"). In an embodiment, the lower conductive layer BML may be electrically connected to an electrode (for example, the source electrode) of the first transistor M1.

In an embodiment in which the first transistor M1 includes the lower conductive layer BML, a back-biasing technique (or a sync technique) for moving a threshold voltage of the first transistor M1 in a negative or positive direction by applying a back-biasing voltage to the lower conductive layer BML of the first transistor M1 may be applied. In case that the lower conductive layer BML may be disposed to overlap a semiconductor pattern constituting a channel of the first transistor M1 (e.g., in a direction or in a plan view), the light incident on the semiconductor pattern may be blocked so that operating characteristics of the first transistor M1 may be stabilized.

The second transistor M2 may be electrically connected between the data line DL and the first node N1. A gate electrode of the second transistor M2 may be electrically connected to the scan line SL of a corresponding horizontal line. The second transistor M2 may be turned on in case that the scan signal SC of a gate-on voltage (for example, a logic high voltage or a high level voltage) may be supplied from the scan line SL to electrically connect the data line DL to the first node N1.

The second transistor M2 may be a switching transistor for transferring each data signal DS to the inside of the pixel PXL. For example, in each frame period, the data signal DS of a corresponding frame may be supplied to the data line DL, and the data signal DS may be transferred to the first node N1 through the second transistor M2 during a period in which the scan signal SC of the gate-on voltage may be supplied. For example, in each horizontal period constituting each frame period, the scan signal SC of the gate-on voltage may be simultaneously supplied to the pixels PXL of a horizontal line corresponding to a corresponding horizontal period. Accordingly, second transistors M2 provided to the pixels PXL of the corresponding horizontal line may be turned on, so that data signals DS supplied to data lines DL may be simultaneously supplied to the pixels PXL of the corresponding horizontal line.

A first electrode of the capacitor Cst may be electrically connected to the first node N1. A second electrode of the capacitor Cst may be electrically connected to the second node N2. The capacitor Cst may be a storage capacitor for storing each data signal DS in the pixel PXL. For example, the capacitor Cst may be charged with a voltage corresponding to the data signal DS supplied to the first node N1 during each frame period.

The third transistor M3 may be electrically connected between the second node N2 and the initialization power source line INL. A gate electrode of the third transistor M3 may be electrically connected to the control line SSL of the corresponding horizontal line. The third transistor M3 may be an initialization transistor for transferring a voltage of the initialization power source VINT to the first electrode ET1 of each pixel PXL during a driving period of the display panel PNL. For example, the third transistor M3 may be turned on by the control signal SSC of a gate-on voltage supplied to a corresponding pixel row. In case that the third transistor M3 is turned on, the voltage of the initialization power source VINT may be transferred to the first electrode ET1 during the driving period of the display panel PNL.

In an embodiment, during the driving period of the display panel PNL, scan signals SC of the gate-on voltage may be sequentially supplied to scan lines SL of each pixel row arranged in the display area DA. Control signals SSC of the gate-on voltage may be sequentially supplied to control lines SSL of each pixel row to be synchronized with the scan signals SC of the gate-on voltage. Accordingly, in each horizontal period, the second and third transistors M2 and M3 of the pixels PXL arranged in the corresponding horizontal line may be turned on, and voltages (for example, a voltage difference between a voltage of the data signal DS and the voltage of the initialization power source VINT corresponding to each pixel PXL) corresponding to the data signals DS supplied to the data lines DL may be stored in capacitors Cst, respectively.

The third transistor M3 may be turned on by the control signal SSC of the gate-on voltage supplied to the corresponding pixel row during a sensing period for detecting characteristics of each pixel PXL. In case that the third transistor M3 is turned on, the second node N2 may be electrically connected to the initialization power source line INL. During the sensing period, the initialization power source line INL may be electrically connected to a sensing circuit. Accordingly, a voltage of the second node N2 may be transferred to the sensing circuit through the initialization power source line INL. The voltage of the second node N2 transferred to the initialization power source line INL may be provided to a driving circuit (for example, a timing controller) via the sensing circuit and used to compensate for a characteristic deviation of the pixels PXL.

In an embodiment, during the sensing period for detecting the characteristics of the pixels PXL, the control signals SSC of the gate-on voltage may be sequentially supplied to the control lines SSL of each pixel row arranged in the display area DA. Accordingly, in each horizontal period, second nodes N2 of the pixels PXL arranged in the corresponding pixel row may be electrically connected to the sensing circuit. Accordingly, the characteristics of the pixels PXL may be detected through the initialization power source line INL during the sensing period.

Figure 5:
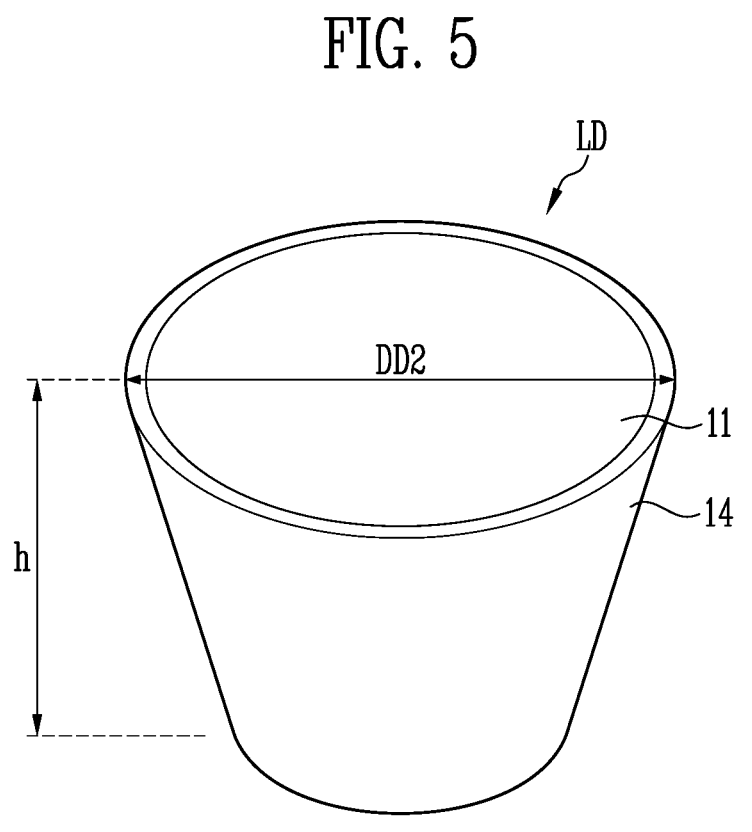
Figure 6:
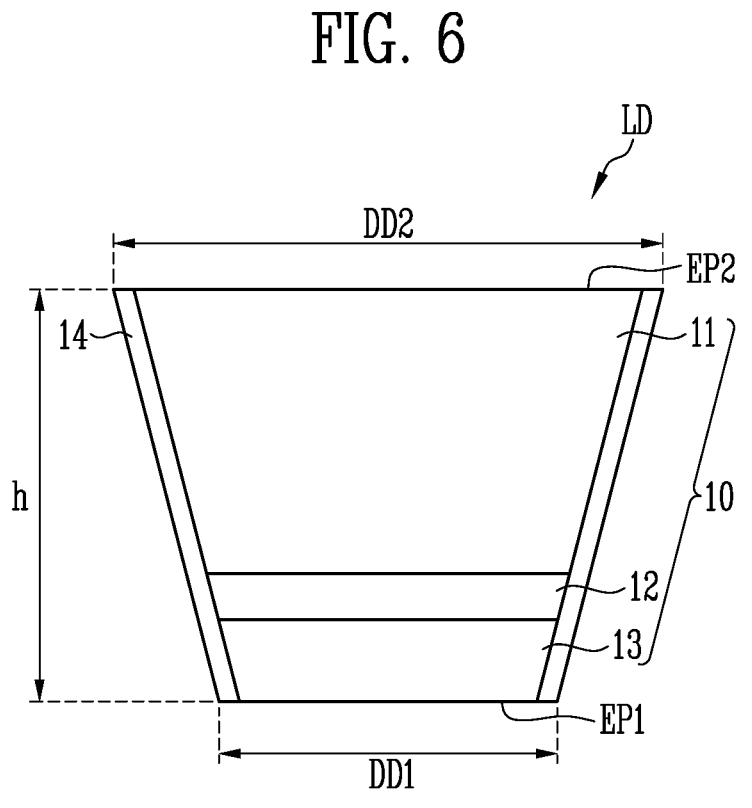

FIG. 5 is a perspective view of a light emitting element according to an embodiment, and FIG. 6 is a schematic cross-sectional view of the light emitting element according to an embodiment. Referring to FIGS. 5 and 6, the light emitting element LD may include a first semiconductor layer 11, an active layer 12, and a second semiconductor layer 13. For example, the light emitting element LD may be composed of a light emitting laminate 10 in which the first semiconductor layer 11, the active layer 12, and the second semiconductor layer 13 may be sequentially stacked on each other. According to an embodiment, the light emitting element LD may further include a bonding electrode layer (not shown), and the bonding electrode layer may be stacked on a surface of the first semiconductor layer 11 or a surface of the second semiconductor layer 13.

In a height h direction of the light emitting element LD, a lower surface may be referred to as a first end EP1, and an upper surface may be referred to as a second end EP2. The light emitting element LD may have a columnar shape in which a diameter DD1 of the first end EP1 and a diameter DD2 of the second end EP2 may be different from each other. For example, the light emitting element LD may have a columnar shape in which the diameter DD1 of the first end EP1 may be smaller than the diameter DD2 of the second end EP2. For example, the light emitting element LD may have an elliptical columnar shape whose diameter increases upward along the height h direction. According to an embodiment, the light emitting element LD may instead have a columnar shape in which the diameter DD1 of the first end EP1 may be greater than the diameter DD2 of the second end EP2. For example, the light emitting element LD may have an elliptical columnar shape whose diameter decreases upward along the height h direction.

According to an embodiment, the shapes of the first end EP1 and the second end EP2 of the light emitting element LD may be implemented as polygons such as a rectangle, a square, an equilateral triangle, and a regular pentagon. According to an embodiment, the light emitting element LD may have a truncated pyramid shape in which an area of the upper surface and an area of the lower surface may be different from each other. The light emitting element LD may have a size of nano-scale to micro-scale. However, the size of the light emitting element LD may not be limited thereto. The size of the light emitting element LD may be variously changed according to design conditions of various devices (for example, a display device, etc.) using a light emitting device using the light emitting element LD as a light source.

The first semiconductor layer 11 may be a first conductive (or type) semiconductor layer. For example, the first semiconductor layer 11 may include at least an n-type semiconductor. For example, the first semiconductor layer 11 may include an n-type semiconductor including InAlGaN, GaN, AlGaN, InGaN, AlN, InN, or a combination thereof and doped with a first conductive dopant such as Si, Ge, Sn, the like, or a combination thereof. However, the material constituting the first semiconductor layer 11 may not be limited thereto, and various other materials may be used to form the first semiconductor layer 11.

The active layer 12 may be disposed on a surface of the first semiconductor layer 11. The active layer 12 may be formed in a single or multiple quantum well structure. In an embodiment, a cladding layer (not shown) doped with a conductive dopant may be formed on upper and/or lower portions of the active layer 12. For example, the clad layer may be formed of AlGaN, InAlGaN, or both. According to an embodiment, a material such as AlGaN, InAlGaN, or both may be used to form the active layer 12, and various other materials may also be used to form the active layer 12.

The second semiconductor layer 13 may be disposed on a surface of the active layer 12. The second semiconductor layer 13 may have a conductivity (or type) different from that of the first semiconductor layer 11. For example, the second semiconductor layer 13 may include at least a p-type semiconductor layer. For example, the second semiconductor layer 13 may include a p-type semiconductor layer including InAlGaN, GaN, AlGaN, InGaN, AlN, InN, or a combination thereof and doped with a second conductive dopant such as Mg, Zn, Ca, Sr, Ba, the like, or a combination thereof. However, the material constituting the second semiconductor layer 13 may not be limited thereto, and various other materials may instead be used to form the second semiconductor layer 13.

According to an embodiment, in addition to the first semiconductor layer 11, the active layer 12, and the second semiconductor layer 13, the light emitting element LD may further include an electrode (not shown) disposed on an upper portion of the first semiconductor layer 11 and/or on a lower portion of the second semiconductor layer 13. The electrode may be an ohmic contact electrode, but the disclosure may not be limited thereto. According to an embodiment, the electrode may instead be a Schottky contact electrode. The electrode may include a conductive material. For example, the electrode may include an opaque metal such as chromium (Cr), titanium (Ti), aluminum (Al), gold (Au), nickel (Ni), oxides thereof, alloys thereof, or a combination thereof. However, the disclosure may not be limited thereto. According to an embodiment, the electrode may include a transparent conductive oxide such as indium tin oxide (ITO), indium zinc oxide (IZO), zinc oxide (ZnO), indium gallium zinc oxide (IGZO), indium tin zinc oxide (ITZO), or a combination thereof.

The light emitting element LD may further include an insulating film 14. According to an embodiment, the insulating film 14 may be omitted or provided to cover only a portion of the light emitting laminate 10. The insulating film 14 may prevent an electrical short circuit that may occur in case that the active layer 12 comes into contact with a conductive material other than the first and second semiconductor layers 11 and 13. The insulating film 14 may minimize surface defects of the light emitting element LD, thereby improving the lifetime and luminous efficiency of the light emitting element LD. In case that the light emitting elements LD may be disposed adjacent to each other, the insulating film 14 may prevent an unwanted short circuit that may occur between the light emitting elements LD. As long as a short circuit between the active layer 12 and an external conductive material can be prevented, whether or not the insulating film 14 may be provided may not be limited.

The light emitting element LD may further include a reflective member (not shown) surrounding an outer peripheral surface of the insulating film 14. The reflective member may include a reflective material so that light emitted from the light emitting element LD may be focused on a specific area while traveling in an image display direction.

In case that a voltage equal to or greater than a threshold voltage may be applied to the lower surface (or the first end EP1) and the upper surface (or the second end EP2) of the light emitting element LD, the light emitting element LD may emit light while electron-hole pairs may be recombined in the active layer 12.

A light emitting device including the above-described light emitting element LD may be used in various types of devices requiring a light source, including a display device. For example, the light emitting elements LD may be disposed in each pixel PXL of the above-described display panel PNL, and the light emitting elements LD may be used as a light source of each pixel PXL. However, the field to which the light emitting element LD may be applied may not be limited to the above-described example. For example, the light emitting element LD may also be used in other types of devices requiring a light source, such as a lighting device.

Figure 7:
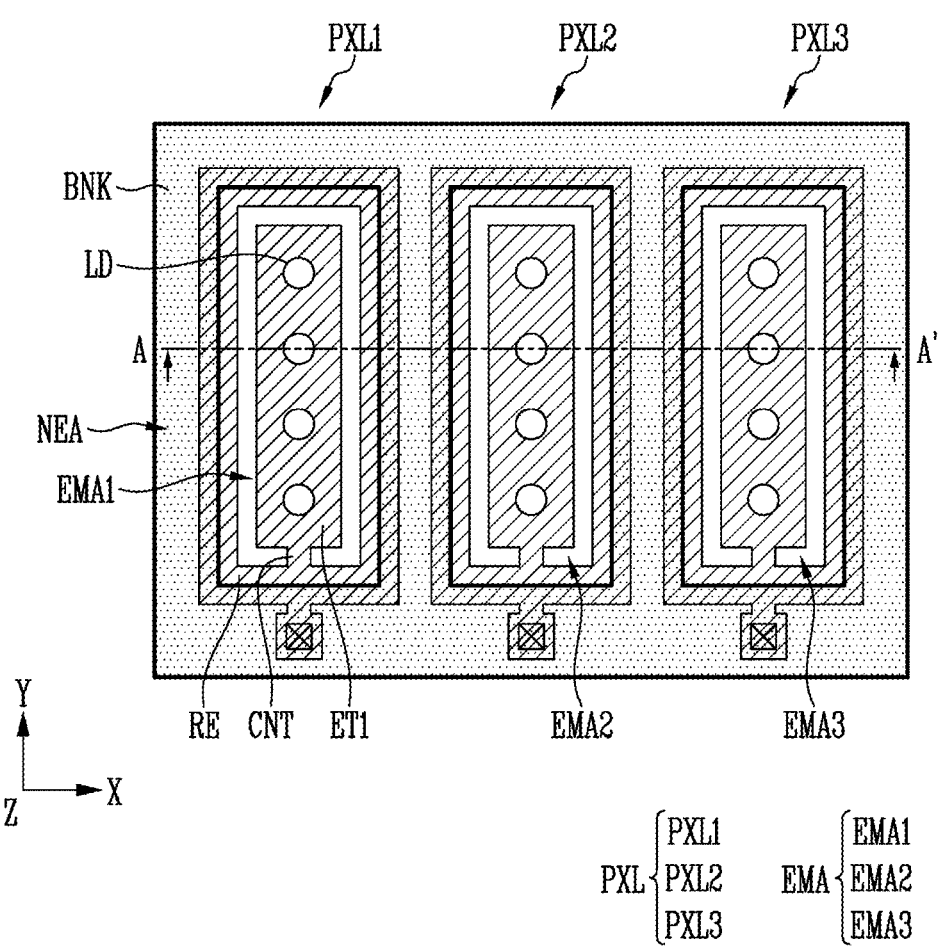
FIGS. 7 and 8 are plan views of a pixel according to an embodiment.
Figure 8:
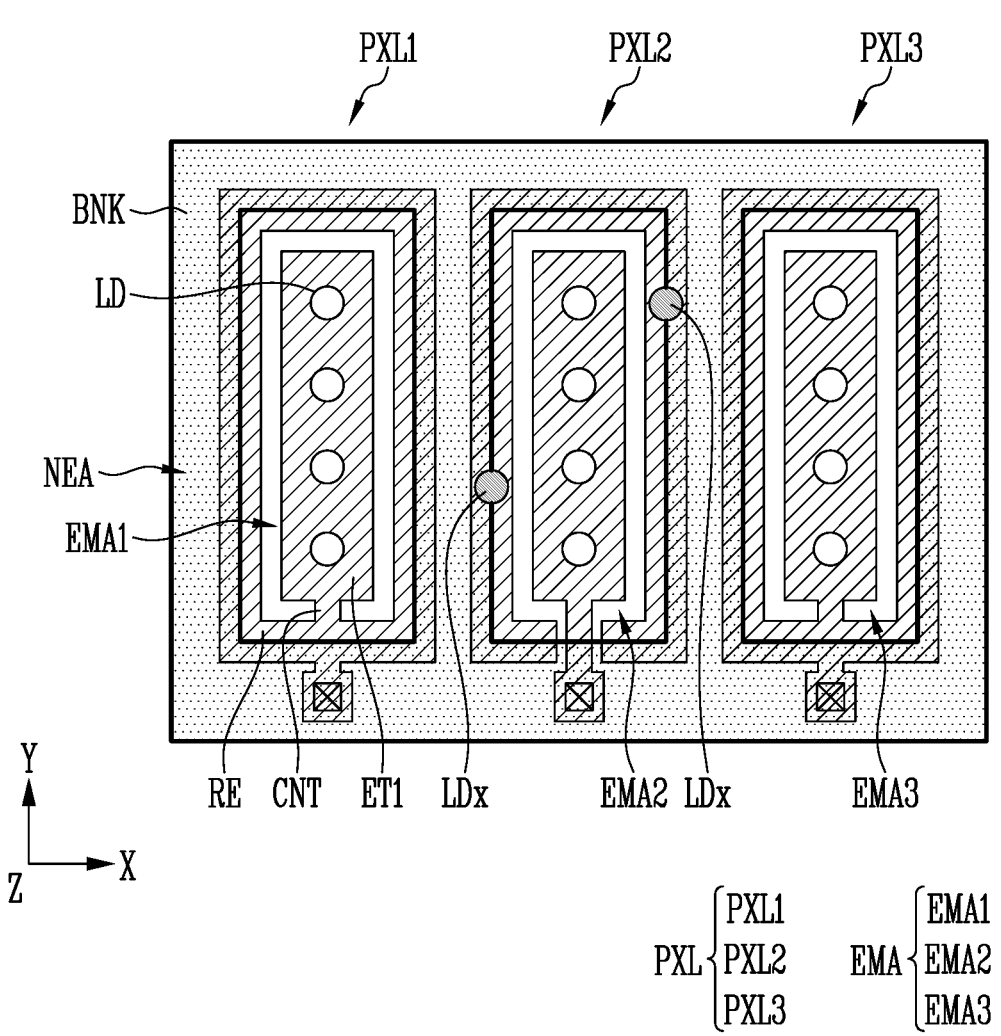
Figure 9:
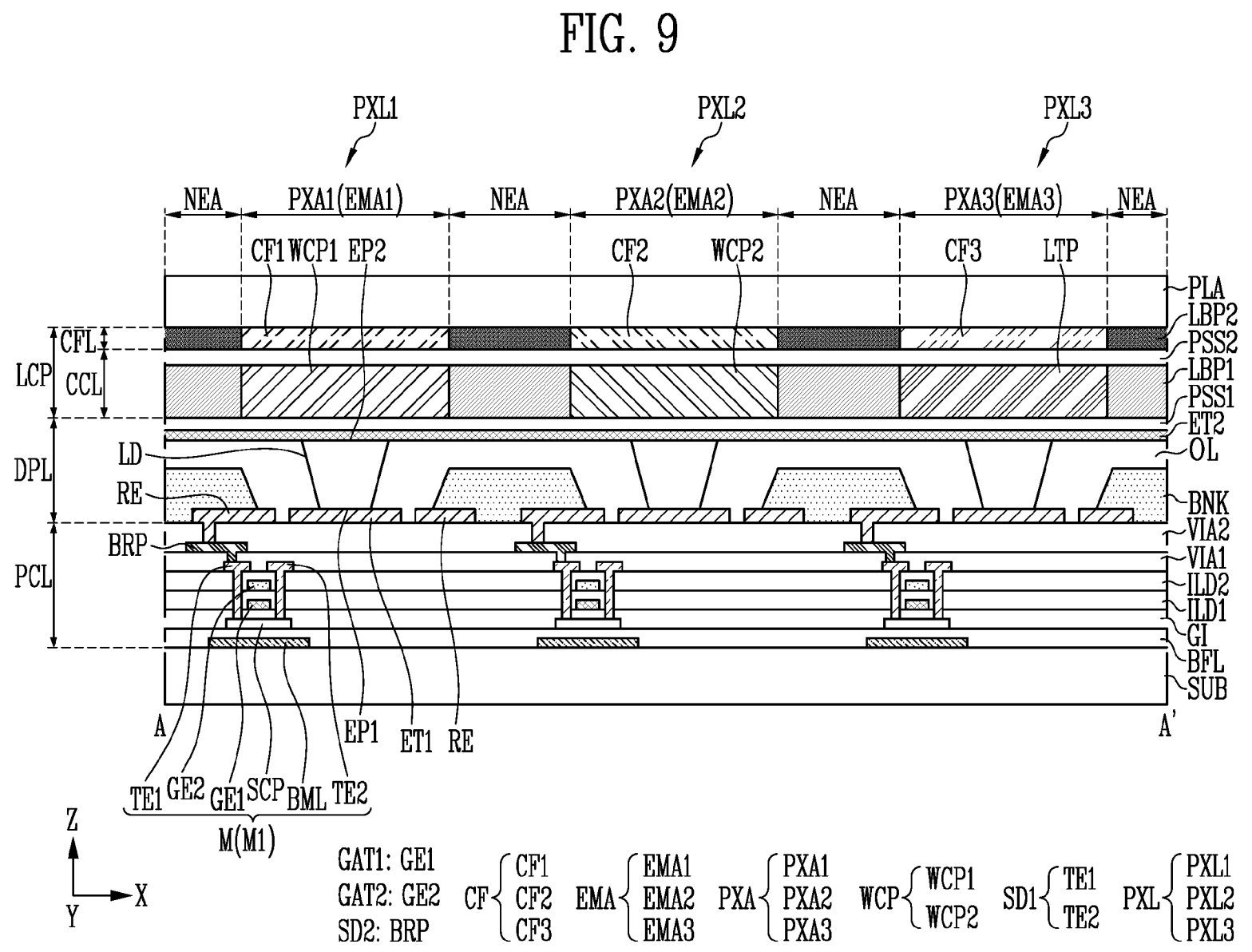

FIGS. 7 and 8 are plan views of the pixel according to an embodiment, and FIG. 9 is a schematic cross-sectional view taken along line A-A' of FIG. 7. Referring to FIGS. 7 to 9, the pixel PXL may include an emission area EMA and a non-emission area NEA. The emission area EMA may include light emitting elements LD and may be an area capable of emitting light. The non-emission area NEA may be disposed to surround the emission area EMA. A bank BNK may be disposed in the non-emission area NEA.

The bank BNK may be disposed between or at a boundary between the first to third pixels PXL1, PXL2, and PXL3 described above. The bank BNK may serve to partition the emission area EMA in which the light emitting elements LD may be provided in the step of supplying the light emitting elements LD to each of the pixels PXL. The bank BNK may surround first to third emission areas EMA1, EMA2, and EMA3 of the first to third pixels PXL1, PXL2, and PXL3, respectively.

The pixel PXL may include a first electrode ET1, an outer electrode RE, and/or the light emitting elements LD. The first electrode ET1 may be disposed in the emission area EMA. The bank BNK may include an opening exposing the first electrode ET1. The light emitting elements LD may be disposed on the first electrode ET1 in the opening of the bank BNK.

The outer electrode RE may be disposed at an outer portion (or an edge) of the emission area EMA. For example, a portion of the outer electrode RE may overlap the emission area EMA, and the remaining portion of the outer electrode RE may overlap the non-emission area NEA. The bank BNK may overlap the outer electrode RE in a plan view. For example, the bank BNK may partially overlap the outer electrode RE in a plan view, and the opening of the bank BNK may partially expose the outer electrode RE.

The outer electrode RE may surround the first electrode ET1. For example, the outer electrode RE may be spaced apart from the first electrode ET1. A connection part CNT may be disposed between the first electrode ET1 and the outer electrode RE.

As shown in FIG. 7, an end of the outer electrode RE may be electrically connected to a side of the connection part CNT. The outer electrode RE may extend from a side of the connection part CNT to extend along an outer portion (or an edge) of the first electrode ET1. The another end of the outer electrode RE may be electrically connected to the another side of the connection part CNT. The first electrode ET1 and the outer electrode RE may be electrically connected to each other by the connection part CNT. The first electrode ET1, the outer electrode RE, and/or the connection part CNT may be disposed on a same layer. The first electrode ET1, the outer electrode RE, and/or the connection part CNT may be simultaneously formed in a same process, but the disclosure may not be necessarily limited thereto.

In a process of bonding the light emitting elements LD in the outer portion (or the edge) of the emission area EMA, the resistance may vary depending on the degree of contact between the light emitting elements LD, which may affect current distribution. For example, a difference in light output efficiency may occur depending on the degree of contact between the light emitting elements LD in the outer portion of the emission area EMA. In an embodiment, in case that a contact failure of the light emitting element LD occurs in the outer portion of the emission area EMA, a defective pixel may be repaired through a process of partially disconnecting (opening) the outer electrode RE of the defective pixel. For example, in case that a contact failure occurs, a defective pixel may be repaired by cutting a portion of the outer electrode RE of the defective pixel with a laser to separate (or electrically disconnect) the outer electrode RE from the first electrode ET1 so that the outer electrode RE is electrically disconnected or insulated from the first electrode ET1.

In FIG. 8, a case in which a contact failure occurs in the outer portion of the second emission area EMA2 of the second pixel PXL2 has been described as an example. A dummy light emitting element LDx in which the contact failure has occurred may be located in the outer portion of the second emission area EMA2. For example, the dummy light emitting element LDx may be disposed on the outer electrode RE. The dummy light emitting element LDx may partially overlap the bank BNK so that the dummy light emitting element LDx may partially contact the outer electrode RE by the bank BNK to affect current distribution. In order to repair such a defective pixel, the outer electrode RE of the defective pixel may be disconnected or separated from the first electrode ET1 and/or the connection part CNT. For example, an end of the outer electrode RE may be spaced apart from a side of the connection part CNT, and the another end of the outer electrode RE may be spaced apart from the another side of the connection part CNT. By disconnecting the outer electrode RE adjacent to the connection part CNT, the outer electrode RE may be separated from the first electrode ET1, so that the defective pixel can be repaired.

Hereinafter, a schematic cross-sectional structure of the pixel PXL will be described in detail with reference to FIG. 9. For convenience of description, in FIG. 9, a pixel area PXA in which the pixel PXL may be disposed may be shown with the emission area EMA of each pixel PXL at the center. However, each pixel area PXA may include a pixel circuit area in which circuit elements constituting each pixel circuit PXC may be disposed, and the emission area EMA in which at least a light emitting element LD constituting each emission part EMU may be disposed. For example, a first pixel area PXA1 in which the first pixel PXL1 may be disposed may include the first emission area EMA1, a second pixel area PXA2 in which the second pixel PXL2 may be disposed may include the second emission area EMA2, and a third pixel area PXA3 in which the third pixel PXL3 may be disposed may include the third emission area EMA3. The non-emission area NEA may be disposed between ones of the first emission area EMA1, the second emission area EMA2, and the third emission area EMA3.

Referring to FIG. 9, the display panel PNL may include the substrate SUB, a pixel circuit part PCL, a display element part DPL, and a light controller LCP sequentially disposed on the substrate SUB. The pixel circuit part PCL may be provided on a surface of the substrate SUB. The pixel circuit part PCL may include circuit elements constituting each pixel PXL. For example, the transistors M and the capacitor Cst constituting the pixel circuit PXC of the corresponding pixel PXL may be formed in each pixel area PXA of the pixel circuit part PCL. In FIG. 9, as an example of circuit elements that may be provided in each pixel area PXA of the pixel circuit part PCL, any one transistor M (for example, the first transistor M1 including the lower conductive layer BML) electrically connected to each light emitting element LD may be shown.

The pixel circuit part PCL may include various signal lines, power source lines, and/or pads electrically connected to the pixels PXL. The pixel circuit part PCL may include multiple conductive layers constituting the various signal lines, power source lines, and/or pads. The pixel circuit part PCL may further include multiple insulating layers disposed between the conductive layers.

The lower conductive layer BML may be disposed on the substrate SUB. The lower conductive layer BML may be formed of a single layer or multiple layers made of at least one of molybdenum (Mo), copper (Cu), aluminum (Al), chromium (Cr), gold (Au), titanium (Ti), nickel (Ni), neodymium (Nd), indium tin oxide (ITO), an alloy thereof, or a combination thereof.

A buffer layer BFL may be disposed on the lower conductive layer BML. The buffer layer BFL may prevent impurities from diffusing into the circuit elements. The buffer layer BFL may be composed of a single layer, but may be composed of at least a double layer or more. In case that the buffer layer BFL may be formed of multiple layers, each layer may be formed of a same material or may be formed of different materials.

A semiconductor pattern SCP may be disposed on the buffer layer BFL. For example, the semiconductor pattern SCP may include a first region in contact with a first transistor electrode TE1, a second region in contact with a second transistor electrode TE2, and a channel region disposed between the first and second regions. According to an embodiment, one of the first and second regions may be a source region and the another may be a drain region.

According to an embodiment, the semiconductor pattern SCP may be formed of polysilicon, amorphous silicon, an oxide semiconductor, or the like. The channel region of the semiconductor pattern SCP may be an intrinsic semiconductor as a semiconductor pattern not doped with impurities, and the first and second regions of the semiconductor pattern SCP may be semiconductors doped with impurities.

A gate insulating layer GI may be disposed on the buffer layer BFL and the semiconductor pattern SCP. For example, the gate insulating layer GI may be disposed between the semiconductor pattern SCP and a first gate electrode GE1. The gate insulating layer GI may be composed of a single layer or multiple layers, and may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof.

A first gate conductive layer GAT1 may be disposed on the gate insulating layer GI. The first gate conductive layer GAT1 may include the first gate electrode GE1 of the transistor M. The first gate electrode GE1 may be disposed to overlap the semiconductor pattern SCP in a third direction (Z-axis direction) on the gate insulating layer GI.

The first gate conductive layer GAT1 may be formed of a single layer or multiple layers made of at least one of titanium (Ti), copper (Cu), indium tin oxide (ITO), molybdenum (Mo), chromium (Cr), gold (Au), nickel (Ni), neodymium (Nd), an alloy thereof, or a combination thereof. For example, the first gate conductive layer GAT1 may be formed of a multilayer in which titanium (Ti), copper (Cu), and/or indium tin oxide (ITO) may be sequentially or repeatedly stacked on each other.

A first interlayer insulating layer ILD1 may be disposed on the first gate conductive layer GAT1. For example, the first interlayer insulating layer ILD1 may be disposed between the first gate electrode GE1 and the first and second transistor electrodes TE1 and TE2. The first interlayer insulating layer ILD1 may be composed of a single layer or multiple layers, and may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof.

A second gate conductive layer GAT2 may be disposed on the first interlayer insulating layer ILD1. The second gate conductive layer GAT2 may include a second gate electrode GE2 of the transistor M. The second gate electrode GE2 may overlap the first gate electrode GE1 in the third direction (Z-axis direction) with the first interlayer insulating layer ILD1 disposed therebetween. The second gate conductive layer GAT2 may be composed of a single layer or multiple layers made of at least one of titanium (Ti), copper (Cu), indium tin oxide (ITO), molybdenum (Mo), chromium (Cr), gold (Au), nickel (Ni), neodymium (Nd), or an alloy thereof. For example, the first gate conductive layer GAT1 may be formed of a multilayer in which titanium (Ti), copper (Cu), indium tin oxide (ITO), or a combination thereof may be sequentially or repeatedly stacked on each other.

A second interlayer insulating layer ILD2 may be disposed on the second gate conductive layer GAT2. For example, the second interlayer insulating layer ILD2 may be disposed between the second gate electrode GE2 and the first and second transistor electrodes TE1 and TE2. The second interlayer insulating layer ILD2 may be composed of a single layer or multiple layers, and may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof.

A first source-drain conductive layer SD1 may be disposed on the second interlayer insulating layer ILD2. The first source-drain conductive layer SD1 may include the first and second transistor electrodes TE1 and TE2 of the transistor M. The first and second transistor electrodes TE1 and TE2 may be disposed to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole penetrating the second interlayer insulating layer ILD2, the first interlayer insulating layer ILD1, and/or the gate insulating layer GI. The second transistor electrode TE2 may be electrically connected to the second region of the semiconductor pattern SCP through a contact hole penetrating the second interlayer insulating layer ILD2, the first interlayer insulating layer ILD1, and/or the gate insulating layer GI. According to an embodiment, one of the first and second transistor electrodes TE1 and TE2 may be a source electrode, and the other may be a drain electrode.

The first source-drain conductive layer SD1 may be formed of a single layer or multiple layers made of at least one of aluminum (Al), molybdenum (Mo), chromium (Cr), gold (Au), titanium (Ti), nickel (Ni), neodymium (Nd), indium tin oxide (ITO) or an alloy thereof.

A first via layer VIA1 may be disposed on the first source-drain conductive layer SD1. The first via layer VIA1 may be composed of a single layer or multiple layers. For example, the first via layer VIA1 may include an organic material such as an acrylates resin, an epoxy resin, a phenolic resin, a polyamides resin, a polyimides resin, a polyesters resin, a polyphenylenesulfides resin, benzocyclobutene (BCB), or a combination thereof. However, the disclosure may not be necessarily limited thereto. The first via layer VIA1 may instead include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof.

A second source-drain conductive layer SD2 may be disposed on the first via layer VIAL The second source-drain conductive layer SD2 may include a bridge pattern BRP. The bridge pattern BRP may serve to electrically connect the transistor M and the first electrode ET1 provided to the emission part EMU of the pixel PXL. For example, the bridge pattern BRP may be electrically connected to the first transistor electrode TE1 of the transistor M through a contact hole penetrating the first via layer VIAL The first electrode ET1 of the corresponding pixel PXL may be electrically connected to the bridge pattern BRP through a contact hole penetrating the second via layer VIA2, which will be described later. The second source-drain conductive layer SD2 may be formed of a single layer or multiple layers made of at least one of aluminum (Al), molybdenum (Mo), chromium (Cr), gold (Au), titanium (Ti), nickel (Ni), neodymium (Nd), indium tin oxide (ITO), or an alloy thereof.

The second via layer VIA2 may be disposed on the second source-drain conductive layer SD2. The second via layer VIA2 may be formed of an organic material to planarize a step difference thereunder. For example, the second via layer VIA2 may include an organic material such as an acrylates resin, an epoxy resin, a phenolic resin, a polyamides resin, a polyimides resin, a polyesters resin, a polyphenylenesulfides resin, benzocyclobutene (BCB), or a combination thereof. However, the disclosure may not be necessarily limited thereto. The second via layer VIA2 may instead include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof.

The display element part DPL may be disposed on the second via layer VIA2. The display element part DPL may include first electrodes ET1, outer electrodes RE, the bank BNK, the light emitting elements LD, an organic layer OL, second electrodes ET2, a first passivation layer PSS1, or a combination thereof.

For example, the first electrode ET1 of each pixel PXL may be disposed on the pixel circuit part PCL and in each emission area EMA. For example, the first electrode ET1 of the first pixel PXL1 may be disposed on the pixel circuit part PCL to be disposed in the first emission area EMA1, the first electrode ET1 of the second pixel PXL2 may be disposed on the pixel circuit part PCL to be disposed in the second emission area EMA2, and the first electrode ET1 of the third pixel PXL3 may be disposed on the pixel circuit part PCL to be disposed in the third emission area EMA3. In an embodiment, each of the first electrodes ET1 may be an anode electrode provided to the corresponding pixel PXL (or the emission part EMU of the corresponding pixel PXL). The first electrodes ET1 of the pixels PXL may be separated from each other.

Each of the first electrodes ET1 may be electrically connected to at least one circuit element constituting the pixel circuit PXC of the corresponding pixel PXL. For example, the first electrode ET1 of the first pixel PXL1 may be electrically connected to at least one circuit element (for example, the transistor M of the first pixel PXL1) constituting the pixel circuit PXC of the first pixel PXL1. The first electrode ET1 of the second pixel PXL2 may be electrically connected to at least one circuit element (for example, the transistor M of the second pixel PXL2) constituting the pixel circuit PXC of the second pixel PXL2. The first electrode ET1 of the third pixel PXL3 may be electrically connected to at least one circuit element (for example, the transistor M of the third pixel PXL3) constituting the pixel circuit PXC of the third pixel PXL3.

The first electrodes ET1 may be disposed on the second via layer VIA2. The first electrodes ET1 may be electrically connected to bridge patterns BRP through contact holes, respectively.

Each of the first electrodes ET1 may be disposed under the light emitting element LD provided in the corresponding pixel PXL and may be electrically connected to the light emitting element LD. For example, each of the first electrodes ET1 may be in contact with the first end EP1 of the light emitting element LD provided in the corresponding pixel PXL, and may be electrically connected to the first end EP1 of the light emitting element LD.

Each of the first electrodes ET1 may transfer an electrical signal provided through the pixel circuit PXC of the corresponding pixel PXL to the first end EP1 of the light emitting element LD. For example, the first electrode ET1 may transfer the voltage of the first power source VDD supplied through each pixel circuit PXC to the first end EP1 of the light emitting element LD provided to the corresponding pixel PXL.

According to an embodiment, each of the first electrodes ET1 may include a bonding metal that may be bonded and electrically coupled to each light emitting element LD. The first electrode ET1 may have conductivity by including at least one conductive material, and the material constituting the first electrode ET1 may not be particularly limited. For example, the first electrode ET1 may include at least one metal of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), titanium (Ti), tantalum (Ta), tungsten (W), and copper (Cu), or may include other conductive materials.

According to an embodiment, the first electrode ET1 may include a reflective conductive material. For example, the first electrode ET1 may be formed of a metal layer having a high reflectance in a visible light wavelength band, for example, a metal layer including at least one of reflective metals such as aluminum (Al), gold (Au), and silver (Ag). Accordingly, the light emitting efficiency of the pixels PXL can be improved.

The outer electrode RE may be disposed in an outer portion of the emission area EMA. For example, a portion of the outer electrode RE may overlap the emission area EMA, and the remaining portion of the outer electrode RE may overlap the non-emission area NEA.

The outer electrode RE may be disposed on the second via layer VIA2. The outer electrode RE and the first electrode ET1 may be disposed on a same layer. The outer electrode RE may include a same material as the first electrode ET1. For example, the outer electrode RE may be simultaneously formed in a same process as the first electrode ET1, but the disclosure may not be limited thereto.

The bank BNK may be disposed on the outer electrode RE and the second via layer VIA2. The bank BNK may be disposed between or at a boundary between ones of the first to third emission areas EMA1, EMA2, and EMA3. For example, the bank BNK may overlap the non-emission area NEA. The bank BNK may include an opening exposing the first electrode ET1. The opening of the bank BNK may partially expose the outer electrode RE. An edge of the outer electrode RE may be covered by the bank BNK. The bank BNK may include at least one light blocking and/or reflective material. For example, the bank BNK may include at least one black matrix material and/or a color filter material of a specific color, and may also include various other materials.

The light emitting element LD may be disposed on the first electrode ET1. The light emitting element LD may be disposed on the first electrode ET1 exposed by the opening of the bank BNK. The first end EP1 of the light emitting element LD may be disposed on the first electrode ET1 to be electrically connected to the first electrode ET1. Since the light emitting element LD has been described in detail with reference to FIGS. 5 and 6, duplicate descriptions thereof will be omitted.

The organic layer OL may be disposed on the first electrode ET1 and the light emitting element LD. The organic layer OL may be disposed between the light emitting elements LD of each pixel PXL. For example, the organic layer OL may be disposed to surround the light emitting elements LD. The organic layer OL may include an organic material such as an acrylates resin, an epoxy resin, a phenolic resin, a polyamides resin, a polyimides resin, a polyesters resin, a polyphenylenesulfides resin, benzocyclobutene (BCB), or a combination thereof but the disclosure may not be necessarily limited thereto.

The second electrode ET2 may be disposed on the organic layer OL. For example, the pixels PXL may share one second electrode ET2. The second electrode ET2 may be disposed on second ends EP2 of the light emitting elements LD to be electrically connected to the second ends EP2 of the light emitting elements LD. The second electrode ET2 may have conductivity by including at least one conductive material. In an embodiment, the second electrode ET2 may include a transparent conductive material. For example, the second electrode ET2 may include at least one material of a conductive oxide such as indium tin oxide (ITO), indium zinc oxide (IZO), zinc oxide (ZnO or $ZnO_2$), indium gallium zinc oxide (IGZO), and an indium tin zinc oxide (ITZO), and a conductive polymer such as PEDOT (poly(3,4-ethylenedioxythiophene), or may include other transparent conductive materials. The second electrode ET2 may be substantially transparent. Accordingly, light output efficiency (for example, a front light emitting rate) of light generated by each light emitting element LD can be improved. The second electrode ET2 may be composed of a single layer or multiple layers, and the shape, structure, and/or size thereof may not be particularly limited.

The first passivation layer PSS1 may be disposed on the second electrode ET2. In an embodiment, the first passivation layer PSS1 may include at least one insulating material, and may be composed of a single layer or multiple layers. For example, the first passivation layer PSS1 may include an organic insulating material, and may planarize a surface of the display element part DPL.

The light controller LCP may be disposed on the display element part DPL. The light controller LCP may be disposed on a path through which light generated from the light emitting elements LD may be emitted. In an embodiment, the light controller LCP may include a color conversion layer CCL and a color filter layer CFL. For example, light emitting elements LD emitting light of the third color (for example, blue) may be disposed in the first pixel PXL1, the second pixel PXL2, and the third pixel PXL3, and a first wavelength conversion pattern WCP1 and a second wavelength conversion pattern WCP2 including first color conversion particles and second color conversion particles may be provided on the first pixel PXL1 and the second pixel PXL2, respectively. Accordingly, a full-color image may be displayed in the display area DA. However, the disclosure may not be necessarily limited thereto, and the first pixel PXL1, the second pixel PXL2, and the third pixel PXL3 may instead include light emitting elements LD emitting light of different colors. For example, the first pixel PXL1, the second pixel PXL2, and the third pixel PXL3 may include red, green, and blue light emitting elements LD, respectively.

The color conversion layer CCL may be disposed on the first passivation layer PSS1. The color conversion layer CCL may include a wavelength conversion pattern WCP, a light transmission pattern LTP, a first light blocking pattern LBP1, and a second passivation layer PSS2. The wavelength conversion pattern WCP may include the first wavelength conversion pattern WCP1 and the second wavelength conversion pattern WCP2.

The first wavelength conversion pattern WCP1 may be disposed to overlap the first emission area EMA1 of the first pixel PXL1. For example, the first wavelength conversion pattern WCP1 may be disposed in an opening of the first light blocking pattern LBP1. The second wavelength conversion pattern WCP2 may be disposed to overlap the second emission area EMA2 of the second pixel PXL2. For example, the second wavelength conversion pattern WCP2 may be disposed in an opening of the first light blocking pattern LBP1.

The light transmission pattern LTP may be disposed to overlap the third emission area EMA3 of the third pixel PXL3. For example, the light transmission pattern LTP may be disposed in an opening of the first light blocking pattern LBP1.

In an embodiment, the first light blocking pattern LBP1 may include openings overlapping the emission areas EMA (for example, the first, second, and third emission areas EMA1, EMA2, and EMA3), respectively. The first wavelength conversion pattern WCP1 may be disposed in the opening of the first light blocking pattern LBP1 overlapping the first emission area EMA1. The second wavelength conversion pattern WCP2 may be disposed in the opening of the first light blocking pattern LBP1 overlapping the second emission area EMA2. The light transmission pattern LTP may be disposed in the opening of the first light blocking pattern LBP1 overlapping the third emission area EMA3.

The first wavelength conversion pattern WCP1 may include first color conversion particles for converting light of the third color emitted from the light emitting element LD provided in the first emission area EMA1 into light of the first color. For example, in case that the light emitting element LD provided in the first emission area EMA1 may be a blue light emitting element emitting blue light and the first pixel PXL1 may be a red pixel, the first wavelength conversion pattern WCP1 may include first quantum dots (for example, red quantum dots) for converting blue light emitted from the blue light emitting element into red light. The type of the first color conversion particles and the color and/or wavelength of light converted in the first wavelength conversion pattern WCP1 may be variously changed according to embodiments.

The second wavelength conversion pattern WCP2 may include second color conversion particles for converting light of the third color emitted from the light emitting element LD provided in the second emission area EMA2 into light of the second color. For example, in case that the light emitting element LD provided in the second emission area EMA2 may be a blue light emitting element emitting blue light and the second pixel PXL2 may be a green pixel, the second wavelength conversion pattern WCP2 may include second quantum dots (for example, green quantum dots) for converting blue light emitted from the blue light emitting element to green light. The type of the second color conversion particles and the color and/or wavelength of light converted in the second wavelength conversion pattern WCP2 may be variously changed according to embodiments.

The light transmission pattern LTP may be provided to efficiently emit light of the third color emitted from the light emitting element LD provided in the third emission area EMA3. For example, in case that the light emitting element LD provided in the third emission area EMA3 may be a blue light emitting element emitting blue light and the third pixel PXL3 may be a blue pixel, the light transmission pattern LTP may include at least one type of light scattering particles (for example, silica or other light scattering particles) for scattering the blue light emitted from the blue light emitting element to increase light efficiency of the pixel PXL.

It may not be necessary for the light scattering particles to be disposed only in the third emission area EMA3. For example, the light scattering particles may also be selectively included in the first wavelength conversion pattern WCP1 and/or the second wavelength conversion pattern WCP2.

The first light blocking pattern LBP1 may overlap the non-emission area NEA. In an embodiment, the first light blocking pattern LBP1 may be formed in a mesh-shaped pattern that surrounds each of the emission areas EMA in a plan view and includes openings corresponding to the emission areas EMA. The first light blocking pattern LBP1 may surround wavelength conversion patterns WCP and light transmission patterns LTP provided in each of the emission areas EMA.

The first light blocking pattern LBP1 may include at least one light blocking material capable of blocking light transmission and absorbing light. For example, the first light blocking pattern LBP1 may include an organic material including at least one of graphite, carbon black, black pigment, black dye, or a combination thereof, at least one metal including chromium Cr, or various other light blocking materials.

The second passivation layer PSS2 may be disposed on the wavelength conversion patterns WCP and the light transmission patterns LTP. In an embodiment, the second passivation layer PSS2 may include at least one insulating material and may be composed of a single layer or multiple layers. For example, the second passivation layer PSS2 may include an organic insulating material and may substantially planarize a surface of the color conversion layer CCL.

The color filter layer CFL may be disposed on the color conversion layer CCL. A first color filter CF1 may be disposed above the light emitting element LD of the first pixel PXL1 and may selectively transmit light of the first color. For example, the first color filter CF1 may include a color filter material of the first color that transmits light of the first color and blocks transmission of light of the second color and the third color.

A second color filter CF2 may be disposed above the light emitting element LD of the second pixel PXL2 and may selectively transmit light of the second color. For example, the second color filter CF2 may include a color filter material of the second color that transmits light of the second color and blocks transmission of light of the first color and the third color.

A third color filter CF3 may be disposed above the light emitting element LD of the third pixel PXL3 and may selectively transmit light of the third color. For example, the third color filter CF3 may include a color filter material of the third color that transmits light of the third color and blocks transmission of light of the first color and the second color.

A second light blocking pattern LBP2 may surround the emission areas EMA (for example, the first, second, and third emission areas EMA1, EMA2, and EMA3). The second light blocking pattern LBP2 may include openings overlapping the first, second, and third emission areas EMA1, EMA2, and EMA3. The openings of the second light blocking pattern LBP2 may correspond to the first, second, and third emission areas EMA1, EMA2, and EMA3, respectively. For example, the openings of the second light blocking pattern LBP2 may have a same or similar shape as the planar shape (refer to FIG. 5) of the emission areas EMA. A width of the openings of the second light blocking pattern LBP2 in a first direction (X-axis direction) may be different from a width of the openings of the second light blocking pattern LBP2 in a second direction (Y-axis direction). For example, the width of the openings of the second light blocking pattern LBP2 in the first direction (X-axis direction) may be smaller than the width of the openings of the second light blocking pattern LBP2 in the second direction (Y-axis direction).

The first color filter CF1 may be disposed to overlap the first emission area EMA1 of the first pixel PXL1. For example, the first color filter CF1 may be disposed in the opening of the second light blocking pattern LBP2. The second color filter CF2 may be disposed to overlap the second emission area EMA2 of the second pixel PXL2. For example, the second color filter CF2 may be disposed in the opening of the second light blocking pattern LBP2. The third color filter CF3 may be disposed to overlap the third emission area EMA3 of the third pixel PXL3. For example, the third color filter CF3 may be disposed in the opening of the second light blocking pattern LBP2.

The second light blocking pattern LBP2 may include at least one light blocking material capable of blocking light transmission and absorbing light. For example, the second light blocking pattern LBP2 may include an organic material including at least one of graphite, carbon black, black pigment, or black dye, at least one metal including chromium (Cr), or various other light blocking materials.

A planarization layer PLA may be disposed on the color filter layer CFL. The planarization layer PLA may cover the color filters CF. The planarization layer PLA may substantially planarize a step difference caused by lower members including the color filter layer CFL. The planarization layer PLA may include an organic insulating material. For example, the planarization layer PLA may include an organic material such as an acrylates resin, an epoxy resin, a phenolic resin, a polyamides resin, a polyimides resin, a polyesters resin, a polyphenylenesulfides resin, benzocyclobutene (BCB), or a combination thereof but the disclosure may not be necessarily limited thereto.

Figure 10:
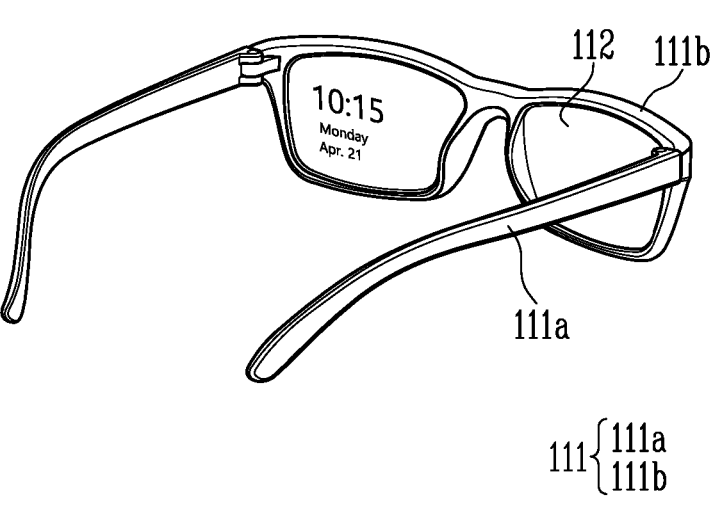
FIGS. 10 to 13 are schematic diagrams illustrating electronic devices according to embodiments.

FIGS. 10 to 13 are schematic diagrams illustrating electronic devices according to embodiments. Referring to FIG. 10, the display device according to the above-described embodiments may be applied to smart glasses. The smart glasses may include a frame 111 and a lens part 112. The smart glasses may be a wearable electronic device that can be worn on a user's face, and may have a structure in which a part of the frame 111 may be folded or unfolded. For example, the smart glasses may be a wearable device for augmented reality (AR).

The frame 111 may include a housing 111b supporting the lens part 112 and a leg part 111a for wearing by a user. The leg part 111a may extend from housing 111b by hinges that fold and unfold.

A battery, touch pad, microphone, and/or camera may be embedded in the frame 111. A projector for outputting light and/or a processor for controlling an optical signal may also be embedded in the frame 111. The lens part 112 may be an optical member that transmits light or reflects light. The lens part 112 may include glass and/or a transparent synthetic resin.

The display device according to the above-described embodiments may be applied to the lens part 112. For example, the user may recognize an image displayed through the lens part 112 by the optical signal transmitted from the projector of the frame 111. For example, the user may recognize information such as time and date displayed on the lens part 112.

Figure 11:
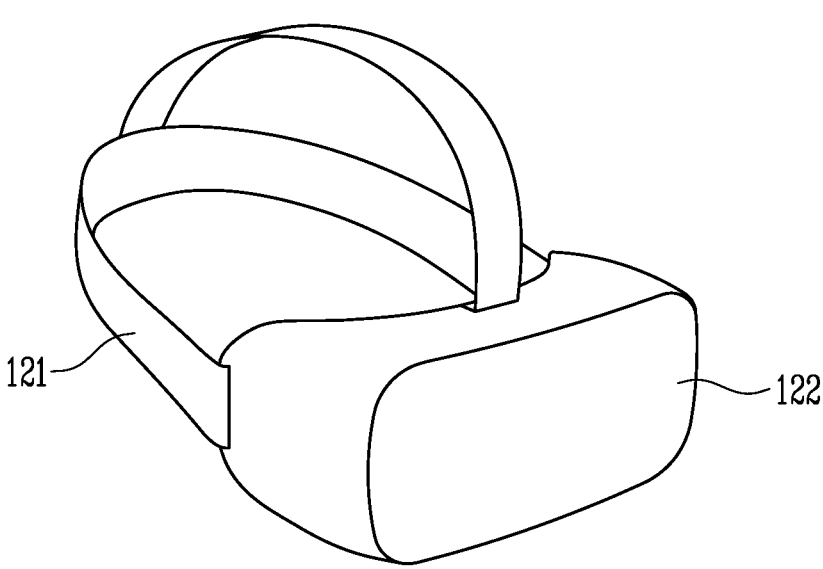

Referring to FIG. 11, the display device according to the above-described embodiments may be applied to a head mounted display (HMD). The head mounted display may include a head mounting band 121 and a display storage case 122. For example, the head mounted display may be a wearable electronic device that can be worn on a user's head.

The head mounting band 121 may extend from the display storage case 122 and be fixed to display storage case 122. The head mounting band 121 may include a horizontal band and a vertical band to fix the head mounted display to the user's head as shown in FIG. 11. The horizontal band may be provided to surround a side portion of the user's head, and the vertical band may be provided to surround an upper portion of the user's head. However, the disclosure may not be necessarily limited thereto, and the head mounting band 121 may be implemented in the form of a spectacle frame or a helmet.

The display storage case 122 may accommodate the display device and may include at least one lens. At least one lens may provide an image to the user. For example, the display device according to the above-described embodiments may be applied to a left eye lens and a right eye lens implemented in the display storage case 122.

Figure 12:
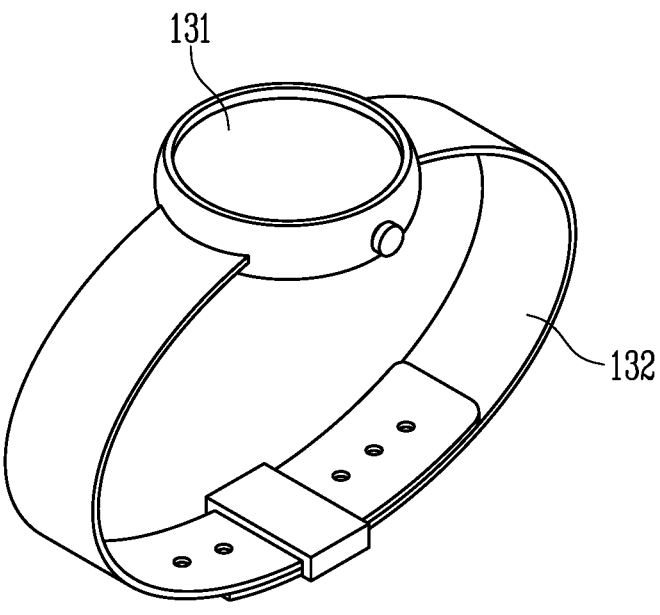

Referring to FIG. 12, the display device according to the above-described embodiments may be applied to a smart watch. The smart watch may include a display part 131 and a strap part 132. The smart watch may be a wearable electronic device, and the strap part 132 may be mounted on a user's wrist. The display device according to the above-described embodiments may be applied to the display part 131. For example, the display part 131 may provide image data including information such as time and date.

Figure 13:
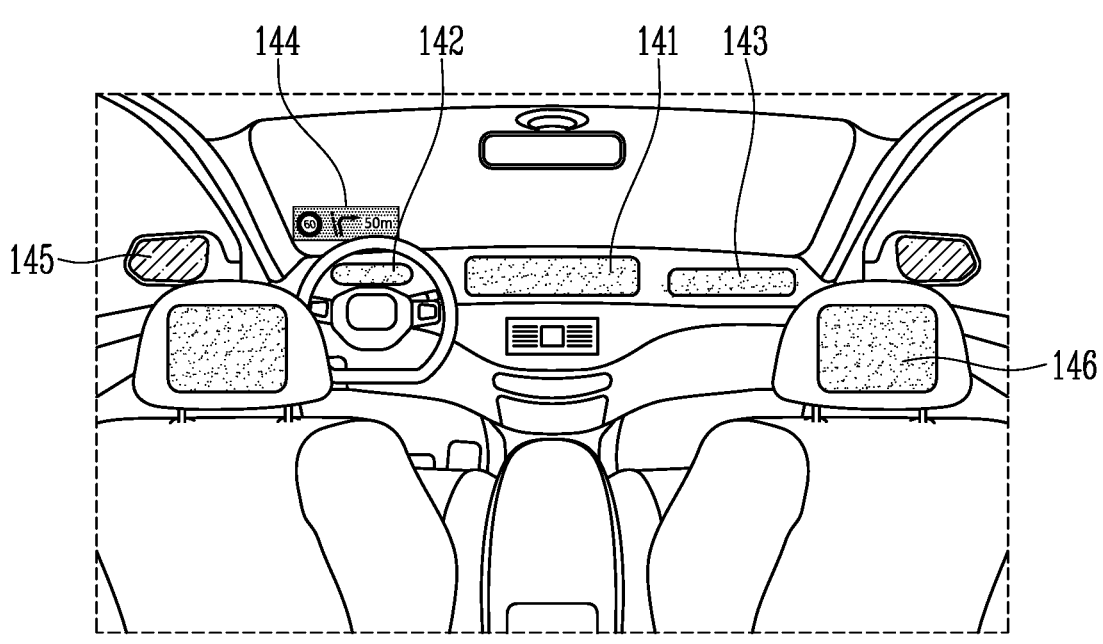

Referring to FIG. 13, the display device according to the above-described embodiments may be applied to an automotive display. For example, the automotive display may refer to an electronic device provided inside and outside a vehicle to provide image data. For example, the display device according to the above-described embodiments may be applied to at least one of an infotainment panel 141, a cluster 142, a co-driver display 143, a head-up display 144, a side mirror display 145, and a rear seat display 146 provided in a vehicle.

According to the above-described embodiments, in case that a contact failure of a light emitting element occurs in an outer portion of an emission area, a defective pixel may be repaired by disconnecting an outer electrode disposed in the outer portion of the emission area.

The effects according to the embodiments of the disclosure may not be limited by the contents disclosed above, more various effects may be included in the disclosure.

Those skilled in the art will appreciate that various modifications and equivalent embodiments may be possible without changing the technical spirit or essential features of the invention. Therefore, it is to be understood that the embodiments as described above have been disclosed for illustrative purposes only and may not be intended to limit the scope of the invention. The true scope of the invention should be determined by the technical idea of the appended claims, rather than by the foregoing description. All changes or modifications derived from the meaning and scope of the claims and their equivalent concepts should be construed as being included in the scope of the invention.

What is claimed is:

1. A display device comprising:
a first electrode;
an outer electrode disposed within a single pixel and forming a closed ring that completely surrounds the first electrode in a plan view and is spaced apart from the first electrode by a continuous gap;
a bank overlapping the outer electrode in a plan view, the bank including an opening that exposes the first electrode;
a light emitting element disposed on the first electrode and in the opening of the bank; and
a second electrode disposed on the light emitting element.

2. The display device of claim 1, wherein the outer electrode is electrically connected to the first electrode.

3. The display device of claim 1, wherein the first electrode and the outer electrode are disposed on a same layer.

4. The display device of claim 1, wherein the light emitting element comprises:
a first conductive semiconductor layer;
an active layer disposed on the first conductive semiconductor layer; and
a second conductive semiconductor layer disposed on the active layer,
wherein the first conductive semiconductor layer, the active layer, and the second conductive semiconductor layer are sequentially stacked to form a discrete micro-light emitting diode chip.

5. The display device of claim 4, further comprising:
a connection part disposed between the outer electrode and the first electrode.

6. The display device of claim 5, wherein the first electrode, the outer electrode, and the connection part are disposed on a same layer.

7. The display device of claim 5, wherein
an end of the outer electrode is electrically connected to a side of the connection part, and another end of the outer electrode is electrically connected to another side of the connection part.

8. The display device of claim 5, wherein the outer electrode is electrically disconnected from the connection part.

9. The display device of claim 1, further comprising:
a dummy light emitting element disposed on the outer electrode.

10. The display device of claim 9, wherein the dummy light emitting element partially overlaps the bank in a plan view.

11. A display device comprising:
a first pixel; and
a second pixel, wherein each of the first pixel and the second pixel includes:
a first electrode;
an outer electrode disposed within a single pixel and forming a closed ring that completely surrounds the first electrode in a plan view and is spaced apart from the first electrode by a continuous gap;
a bank overlapping the outer electrode in a plan view, the bank including an opening that exposes the first electrode;
a light emitting element disposed on the first electrode and in the opening of the bank; and
a second electrode disposed on the light emitting element.

12. The display device of claim 11, wherein the outer electrode of the first pixel is electrically connected to the first electrode of the first pixel.

13. The display device of claim 11, wherein the outer electrode of the second pixel is separated from the first electrode of the second pixel.

14. The display device of claim 13, wherein the second pixel further includes a dummy light emitting element disposed on the outer electrode of the second pixel.

15. The display device of claim 14, wherein the dummy light emitting element partially overlaps the bank in a plan view.

16. The display device of claim 11, further comprising:
a connection part disposed between the outer electrode and the first electrode in each of the first and second pixels.

17. The display device of claim 16, wherein
an end of the outer electrode of the first pixel is electrically connected to a side of the connection part, and
another end of the outer electrode of the first pixel is electrically connected to another side of the connection part.

18. The display device of claim 16, wherein the outer electrode of the second pixel is separated from the connection part of the second pixel.

* * * * *